(12) United States Patent
Dote et al.

(10) Patent No.: US 10,008,436 B2
(45) Date of Patent: Jun. 26, 2018

(54) SEMICONDUCTOR DEVICE

(71) Applicant: FUJITSU LIMITED, Kawasaki-shi, Kanagawa (JP)

(72) Inventors: Aki Dote, Isehara (JP); Takeshi Ishitsuka, Isehara (JP); Hideki Kitada, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 78 days.

(21) Appl. No.: 15/081,433

(22) Filed: Mar. 25, 2016

(65) Prior Publication Data

US 2016/0351474 A1 Dec. 1, 2016

(30) Foreign Application Priority Data

May 25, 2015 (JP) ................. 2015-105379

(51) Int. Cl.
| | | |
|---|---|---|
| *H01L 21/70* | (2006.01) | |
| *H01L 23/48* | (2006.01) | |
| *H01L 23/00* | (2006.01) | |
| *H01L 21/768* | (2006.01) | |
| *H01L 21/8234* | (2006.01) | |
| *H01L 21/31* | (2006.01) | |
| *H01L 23/31* | (2006.01) | |

(52) U.S. Cl.
CPC ............ *H01L 23/481* (2013.01); *H01L 21/31* (2013.01); *H01L 21/76898* (2013.01); *H01L 21/823475* (2013.01); *H01L 21/823481* (2013.01); *H01L 23/562* (2013.01); *H01L 23/3114* (2013.01)

(58) Field of Classification Search
CPC ............ H01L 21/76895; H01L 23/481; H01L 23/562; H01L 21/823475
See application file for complete search history.

(56) References Cited

U.S. PATENT DOCUMENTS

| | | | | |
|---|---|---|---|---|
| 3,560,810 | A * | 2/1971 | Balk ..................... | H01L 21/316 257/406 |
| 6,909,188 | B2 * | 6/2005 | Akiyama .......... | H01L 21/76802 257/750 |
| 7,563,714 | B2 * | 7/2009 | Erturk ............... | H01L 21/76898 257/E21.597 |
| 7,692,315 | B2 * | 4/2010 | Watanabe ......... | H01L 23/53295 257/758 |

(Continued)

FOREIGN PATENT DOCUMENTS

| | | |
|---|---|---|
| JP | 2010-103433 | 5/2010 |
| JP | 2014-011248 | 1/2014 |

(Continued)

*Primary Examiner* — Joseph C Nicely
*Assistant Examiner* — Tuan A Hoang
(74) *Attorney, Agent, or Firm* — Fujitsu Patent Center

(57) ABSTRACT

A semiconductor device includes: a semiconductor substrate; a wiring layer provided on a front-surface side of the semiconductor substrate; a through-via that penetrates through the semiconductor substrate from a back-surface side of the semiconductor substrate and is coupled to a wire included in the wiring layer; and a stress relaxation part that protrudes toward a through-via side and is disposed on a section in the wire and coupled to the through-via, the stress relaxation part including at least one insulating portion containing an insulating material having a smaller thermal expansion coefficient than a material of the through-via.

9 Claims, 17 Drawing Sheets

(56) References Cited

U.S. PATENT DOCUMENTS

| | | | |
|---|---|---|---|
| 8,900,994 B2* | 12/2014 | Yu | ............................ H01L 24/05 |
| | | | 257/621 |
| 2010/0102454 A1 | 4/2010 | Akiyama | |
| 2013/0313689 A1* | 11/2013 | Torii | ...................... H01L 23/481 |
| | | | 257/621 |

FOREIGN PATENT DOCUMENTS

| | | | |
|---|---|---|---|
| JP | 2014-011248 A | * | 1/2014 |
| JP | 2014011248 A | * | 1/2014 |

\* cited by examiner

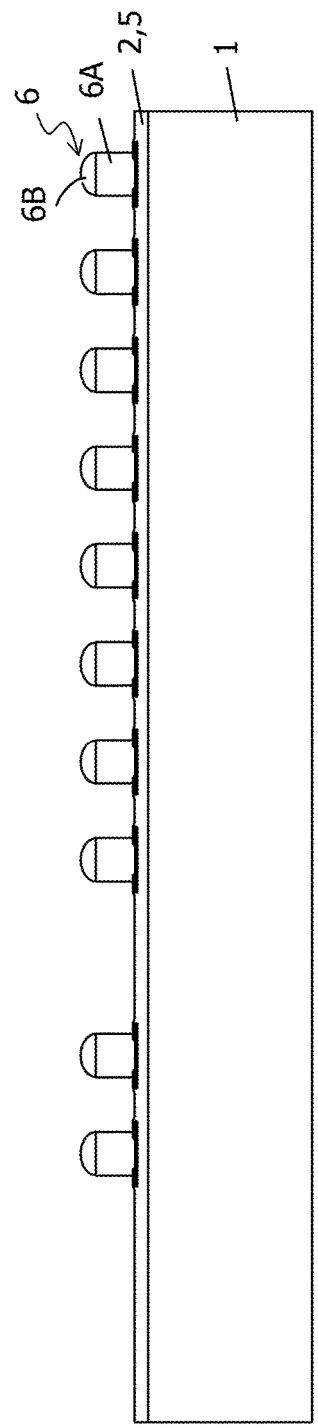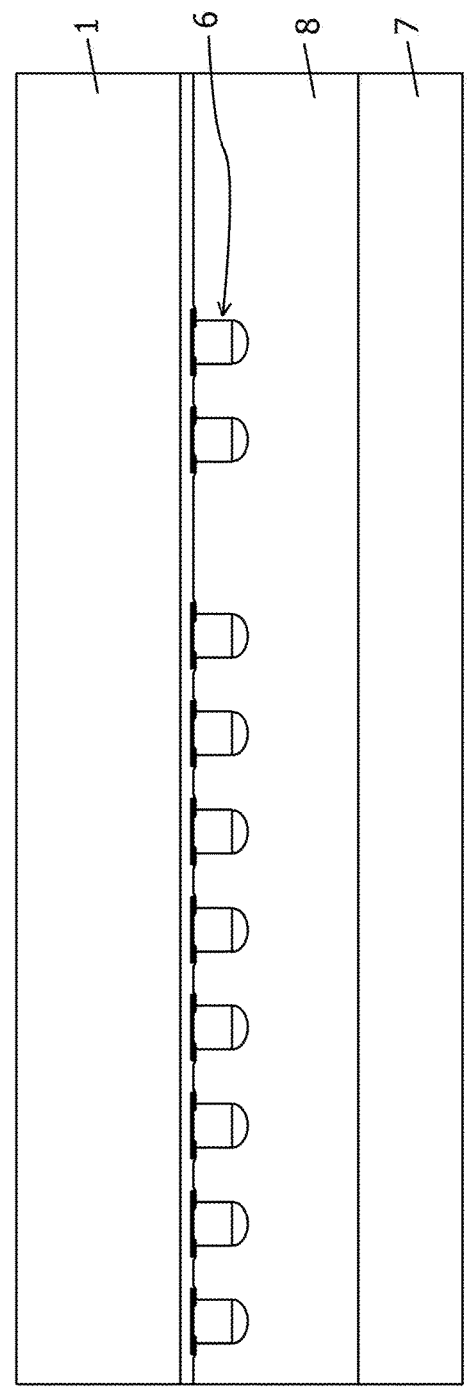
FIG. 7A
FIG. 7B

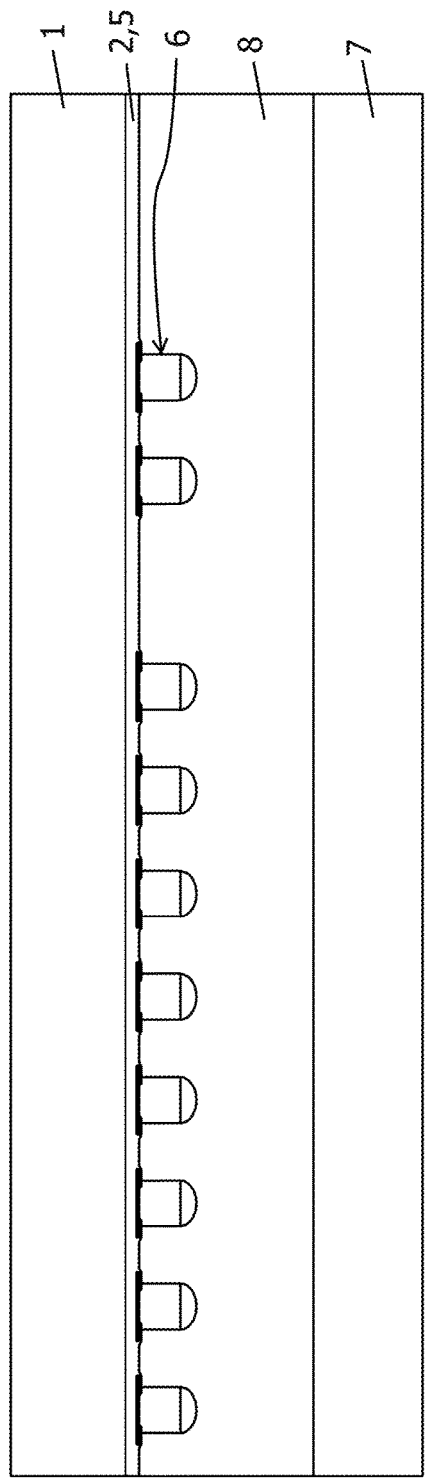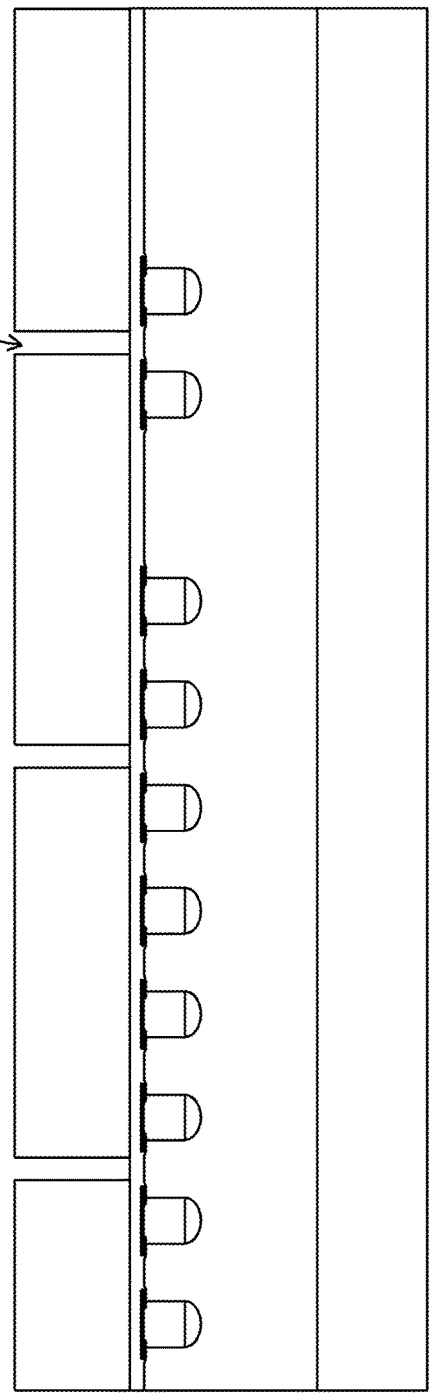

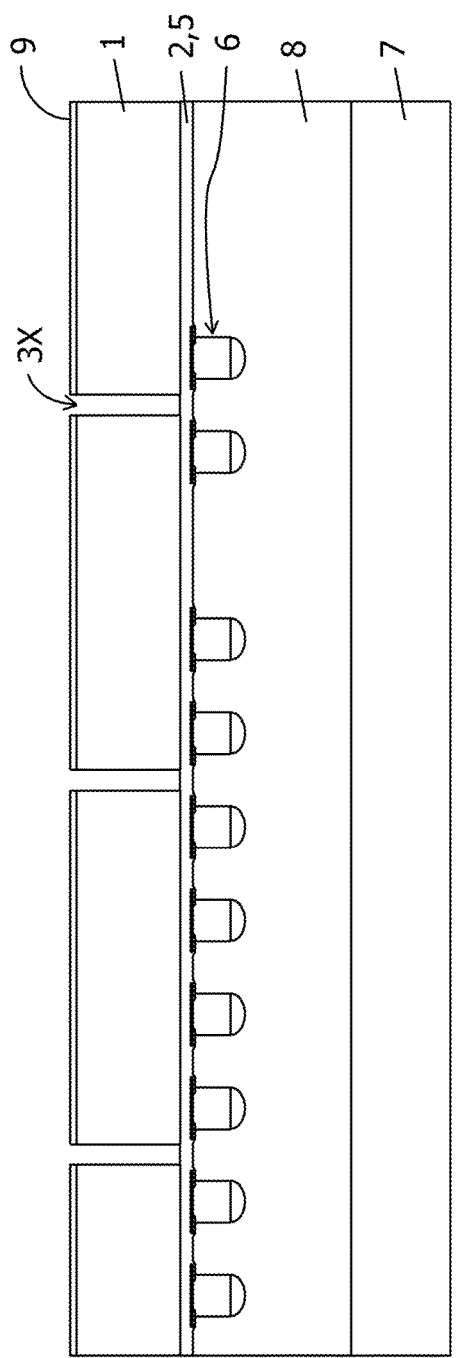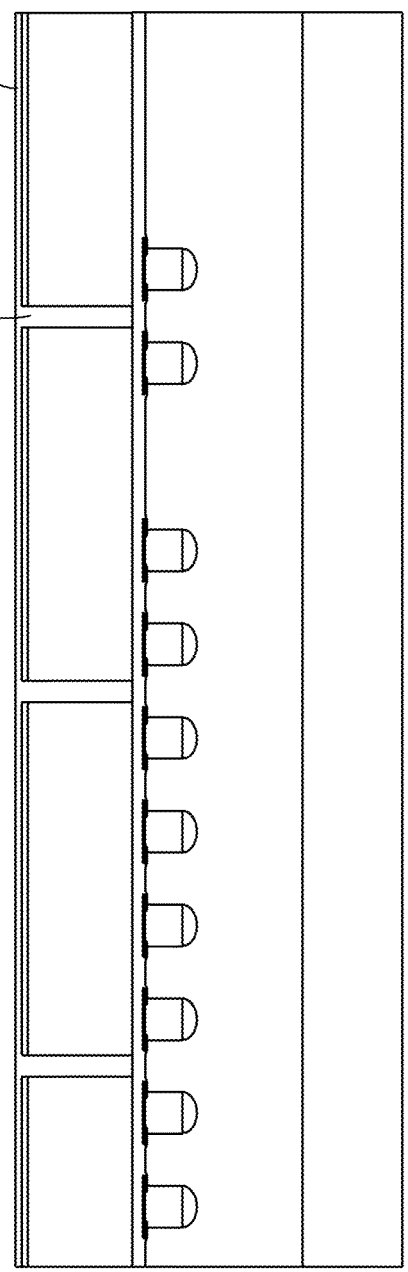

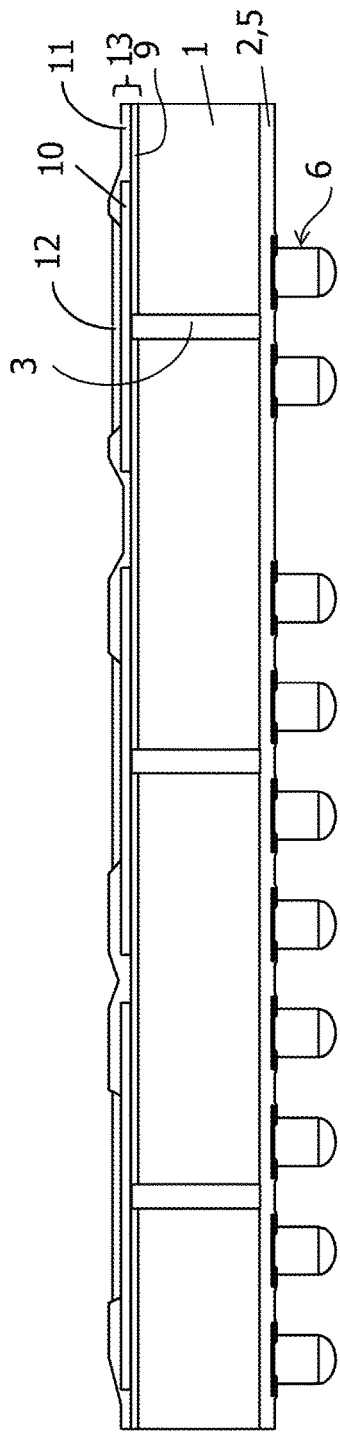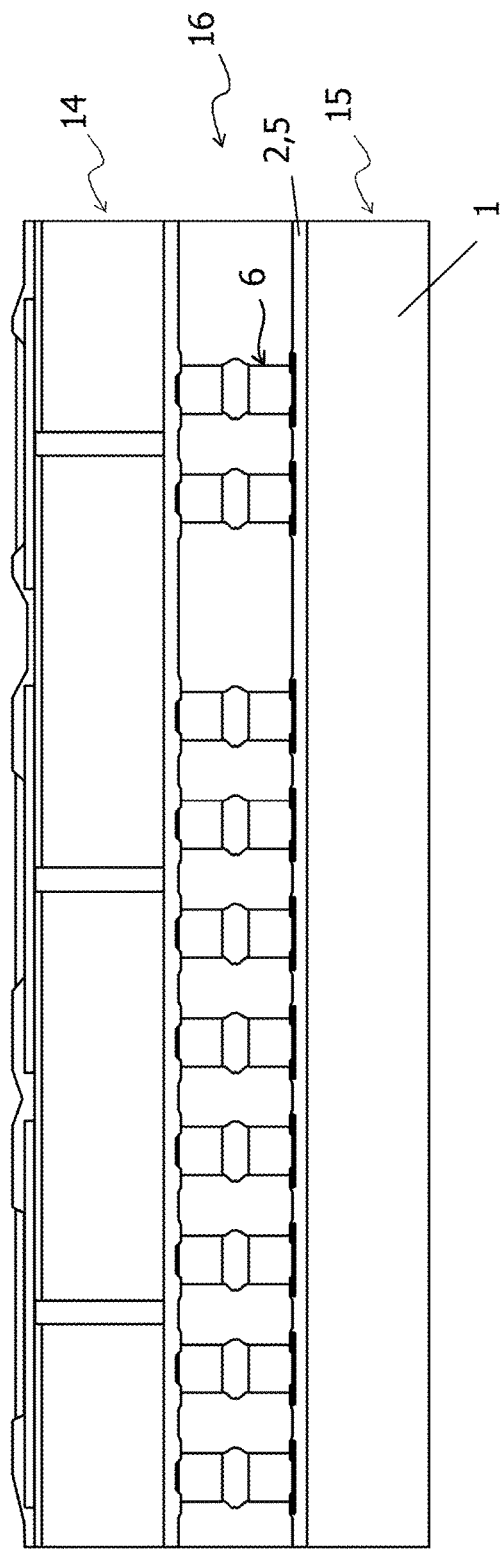

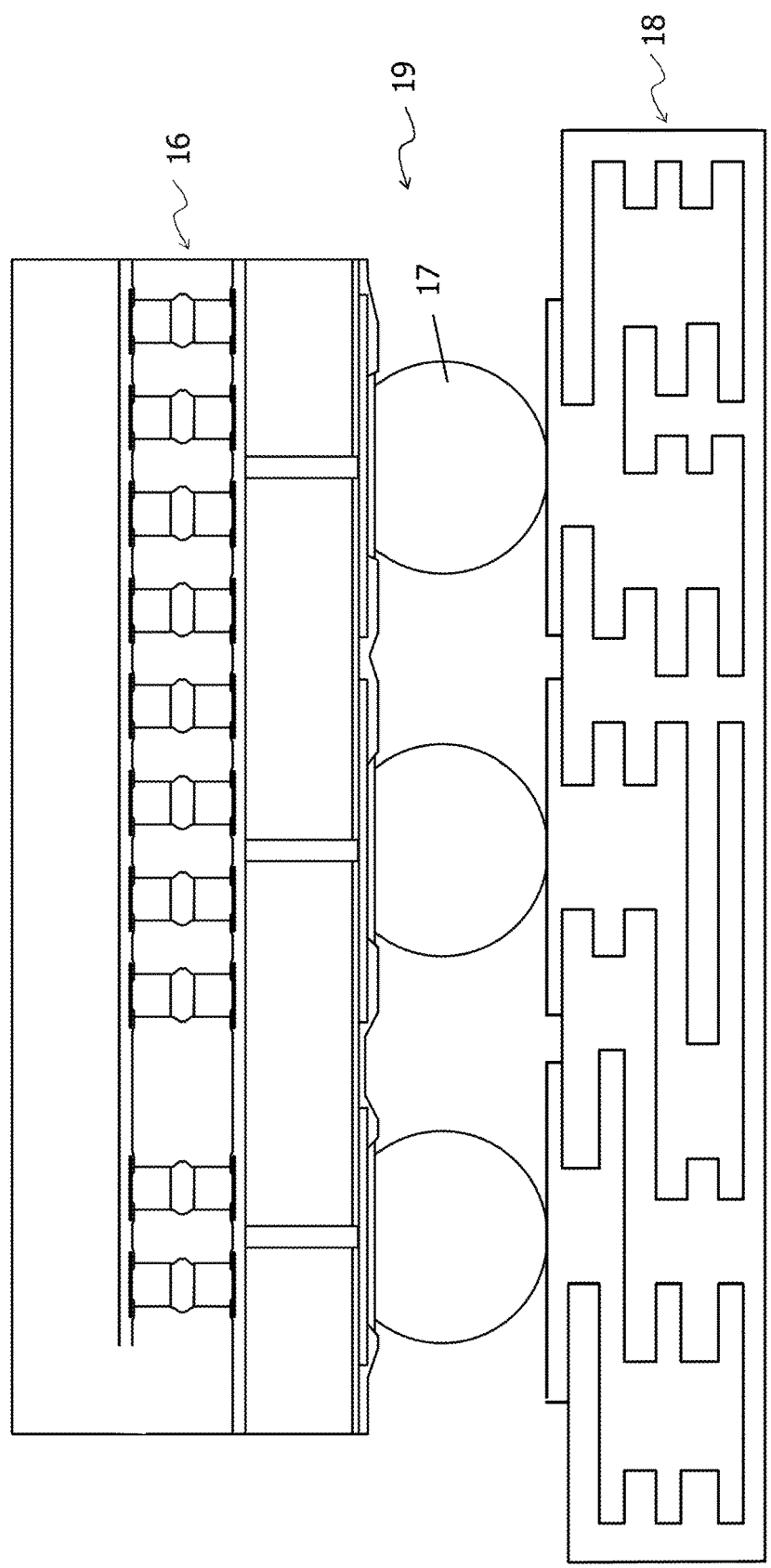

SEMICONDUCTOR DEVICE

CROSS-REFERENCE TO RELATED APPLICATION

This application is based upon and claims the benefit of priority of the prior Japanese Patent Application No. 2015-105379, filed on May 25, 2015, the entire contents of which are incorporated herein by reference.

FIELD

The embodiments discussed herein are related to a semiconductor device and a method for fabricating a semiconductor device.

BACKGROUND

Semiconductor chips are stacked and packaged with the trend toward high-performance computing (HPC), high-performance servers, and the like.

Related techniques are disclosed in Japanese Laid-open Patent Publication No. 2014-11248 and Japanese Laid-open Patent Publication No. 2010-103433.

SUMMARY

According to an aspect of the embodiments, a semiconductor device includes: a semiconductor substrate; a wiring layer provided on a front-surface side of the semiconductor substrate; a through-via that penetrates through the semiconductor substrate from a back-surface side of the semiconductor substrate and is coupled to a wire included in the wiring layer; and a stress relaxation part that protrudes toward a through-via side and is disposed on a section in the wire and coupled to the through-via, the stress relaxation part including at least one insulating portion containing an insulating material having a smaller thermal expansion coefficient than a material of the through-via.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 7A and 7B illustrate the example of the method for fabricating the semiconductor device;

FIGS. 8A and 8B illustrate the example of the method for fabricating the semiconductor device;

FIGS. 9A and 9B illustrate the example of the method for fabricating the semiconductor device;

FIGS. 11A and 11B illustrate the example of the method for fabricating the semiconductor device;

FIG. 12 illustrates the example of the method for fabricating the semiconductor device;

DESCRIPTION OF EMBODIMENTS

For example, three-dimensional (3D) packaging involves stacking and packaging semiconductor chips, and 2.5-dimensional (2.5D) packaging involves stacking and packaging semiconductor chips using an interposer. In 3D packaging and 2.5D packaging, flip chip bonding is used for electrical interconnection between semiconductor chips or between a semiconductor chip and an interposer.

A semiconductor chip and an interposer are provided with a through-via that penetrates through a semiconductor substrate from the back-surface side of the semiconductor substrate. The through-via is coupled to a wire included in a wiring layer provided on the front-surface side of the semiconductor substrate.

Figure 13A:
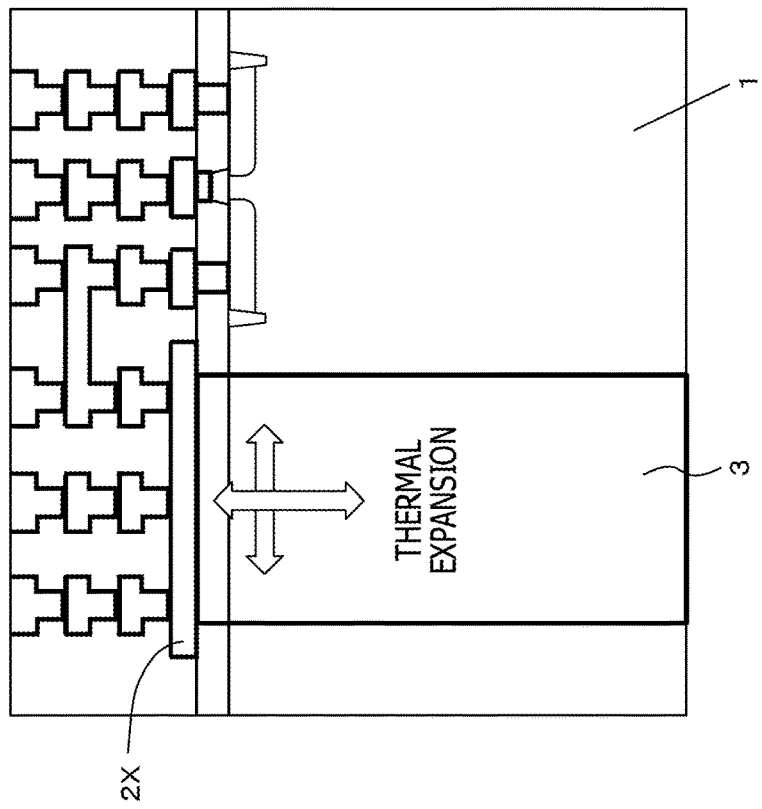
FIGS. 13A and 13B are examples of cross-sectional views of a semiconductor device.
Figure 13B:
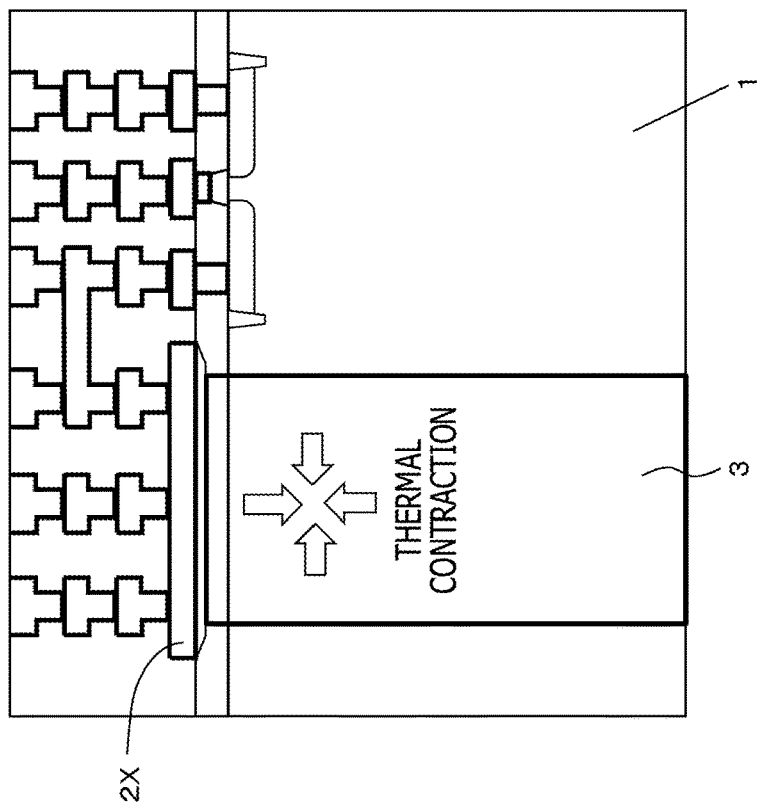
Figure 14A:
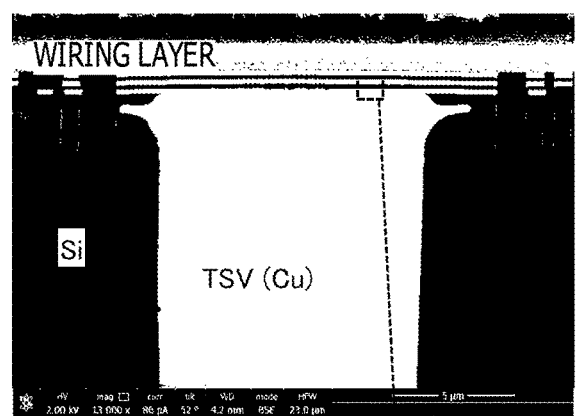
FIGS. 14A and 14B are examples of cross-sectional views of a semiconductor device.
Figure 14B:
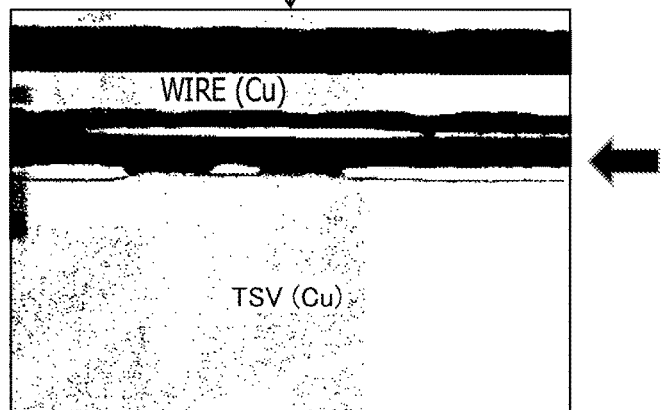

FIGS. 13A and 13B are examples of cross-sectional views of a semiconductor device. FIGS. 14A and 14B are examples of cross-sectional views of a semiconductor device. A through-via has a large volume and the material of the through-via has a larger thermal expansion coefficient than the material of a semiconductor substrate. Because of this, stress is generated at the interface of the junction section between the through-via and the wire as a result of, for example, repeated expansion and contraction due to the heat generated during the fabrication process, and hence separation may occur at the interface of the junction section as illustrated in FIGS. 13A and 13B and FIGS. 14A and 14B.

For example, in order to relax the stress generated at the interface of the junction section between the through-via and the wire and to reduce occurrence of separation at the interface of the junction section, the wire to be connected to the through-via is provided with a protrusion that protrudes toward the through-via side. When the material of the protrusion has a larger thermal expansion coefficient than the material of the through-via, the stress generated at the interface of the junction section between the through-via and the wire may not be relaxed, or occurrence of separation may not be reduced at the interface of the junction section.

Figure 15:
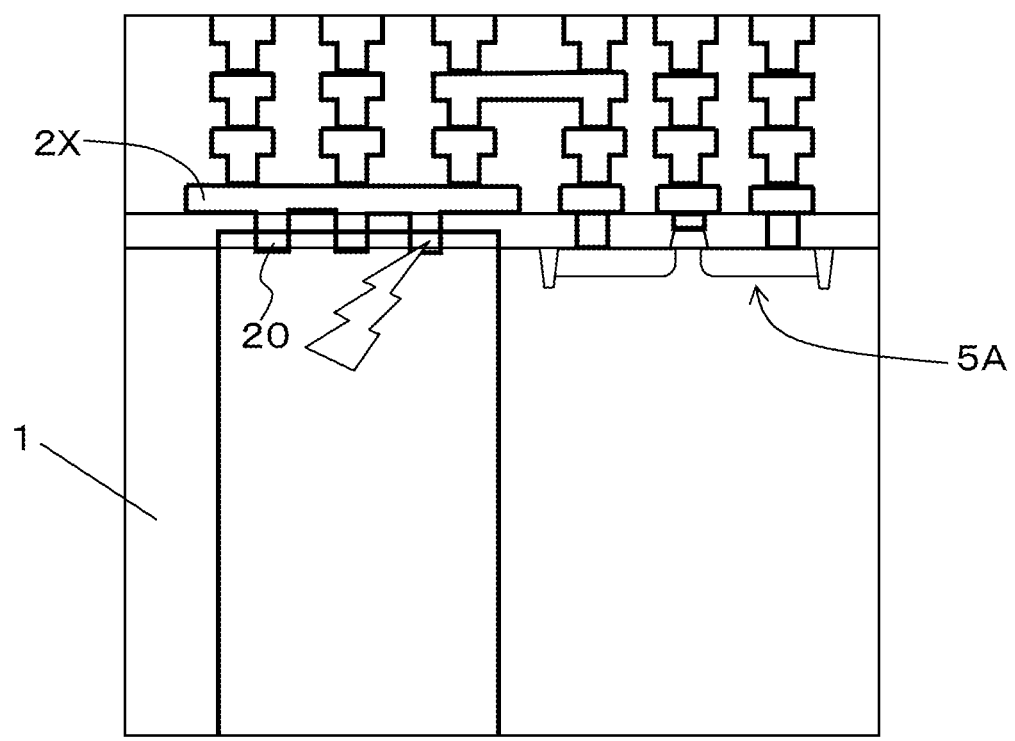
FIG. 15 is an example of a cross-sectional view of a semiconductor device.

When the protrusion is made of metal and a region for forming the through-via is etched away, the electric field is concentrated at the protrusion made of metal, for example, as illustrated in FIG. 15, and a circuit including a transistor and the like may be damaged (charge damage) via the wire having the protrusion.

Figure 1B:
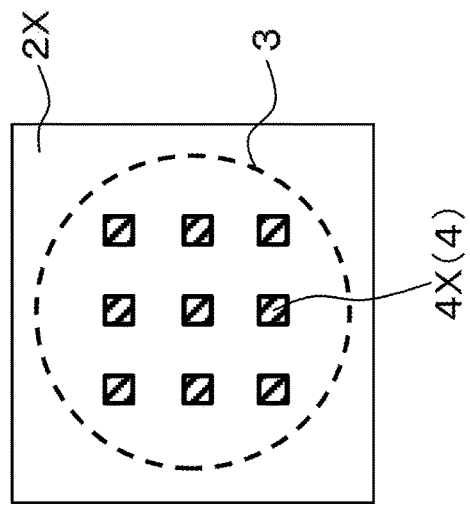
FIGS. 1A and 1B illustrate an example of a semiconductor device.
Figure 1A:
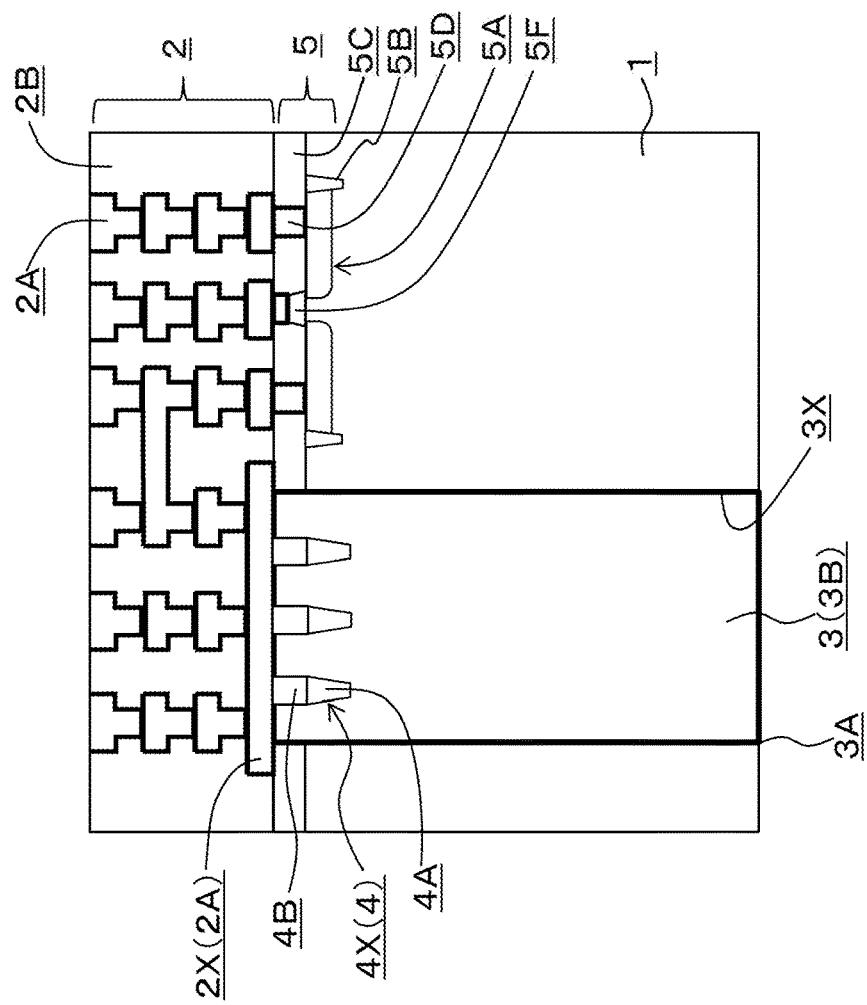
Figure 2A:
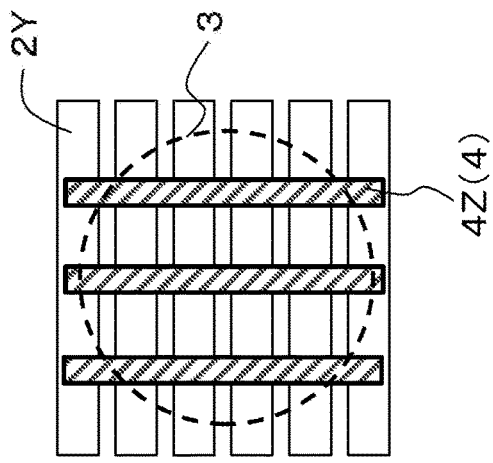
FIGS. 2A to 2C illustrate examples of wires having stress relaxation parts.
Figure 2B:
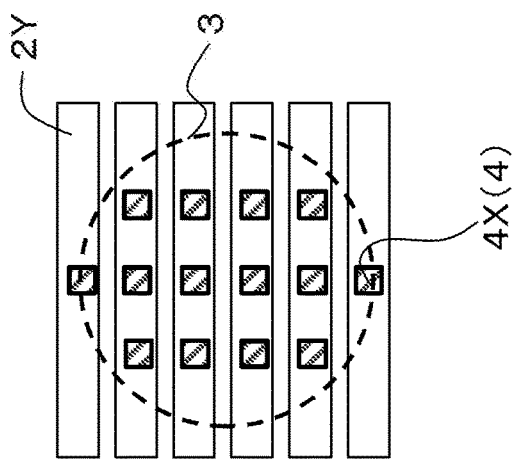
Figure 2C:
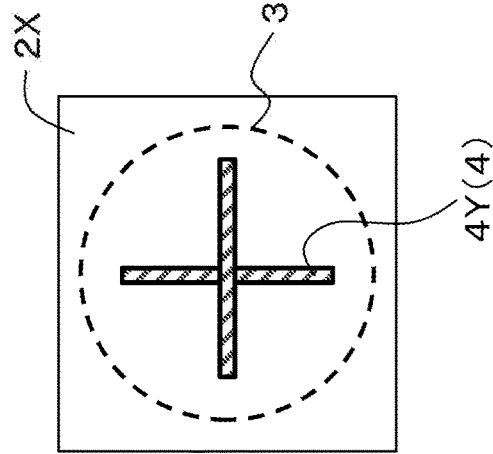

FIGS. 1A and 1B illustrate an example of a semiconductor device. FIG. 1A is a cross-sectional view of the semiconductor device, and FIG. 1B is a plan view of a wire (a pad) having stress relaxation parts as viewed from the side on which a through-via is to be provided. FIGS. 2A to 2C illustrate examples of wires (or a pad) having stress relaxation parts. FIGS. 2A to 2C are plan views of wires (or a pad) having stress relaxation parts as viewed from the side on which a through-via is to be provided. As illustrated in FIG. 1A, the semiconductor device includes a semiconductor substrate 1, a wiring layer 2 provided on the front-surface side of the semiconductor substrate 1, and a through-via 3 that penetrates through the semiconductor substrate 1 from the back-surface side of the semiconductor substrate 1 and is coupled to a wire 2X included in the wiring layer 2. In FIG. 1A, an insulating layer formed around the through-via 3, for example, an insulating layer formed on the side wall of a through-hole, is not illustrated. The reference sign 5F in FIG. 1A indicates a gate electrode.

A stress relaxation part 4 is formed on a section of the wire 2X included in the wiring layer 2, the section being coupled to the through-via 3, such that the stress relaxation part 4 protrudes toward the through-via 3 side. The stress relaxation part 4 includes a portion made of an insulating material having a smaller thermal expansion coefficient than the material of the through-via 3. The stress relaxation part 4 has a protruding shape (protruding structure). For this, the stress relaxation part 4 may be referred to as a protrusion.

As illustrated in FIGS. 1A and 1B, plural stress relaxation parts 4 are provided as the stress relaxation part 4. For example, plural pillar-shaped stress relaxation parts 4X are provided as the protruding stress relaxation part 4 on a pad (electrode) 2X in wires included in the wiring layer 2, the pad (electrode) 2X being coupled to the through-via 3. The stress relaxation part 4 is not limited to this. For example, as illustrated in FIG. 2A, plate-shaped stress relaxation parts 4Y that extend in the radial direction of the through-via 3 and intersect at a right angle may be provided as the protruding stress relaxation part 4 on the pad (electrode) 2X in the wires included in the wiring layer 2, the pad (electrode) 2X being coupled to the through-via 3. For example, as illustrated in FIG. 2B, plural pillar-shaped stress relaxation parts 4X may be provided as the protruding stress relaxation part 4 on plural wires 2Y in the wires included in the wiring layer 2, the wires 2Y being coupled to the through-via 3. For example, as illustrated in FIG. 2C, plural plate-shaped stress relaxation parts 4Z that extend so as to intersect the plural wires 2Y at a right angle may be provided as the protruding stress relaxation part 4 on the plural wires 2Y in the wires included in the wiring layer 2, the wires 2Y being coupled to the through-via 3. In order to obtain the stress relaxation effect while suppressing an increase in resistance, plural pillar-shaped stress relaxation parts 4X having a size (e.g., diameter) reduced in the direction along the interface of the junction section between the through-via 3 and the wire 2X or the wire 2Y may be provided.

The stress relaxation part 4 is a part that relaxes the stress generated at the interface of the junction section between the through-via 3 and the wire 2X. Since the stress relaxation part 4 includes a portion made of a material having a smaller thermal expansion coefficient than the material of the through-via 3, the stress (thermal stress) generated at the interface of the junction section between the through-via 3 and the wire 2X is relaxed. For example, the stress generated due to longitudinal deformation of the through-via 3 having a large volume may be relaxed by the stress relaxation part 4. For example, the stress generated due to longitudinal deformation of the through-via 3 having a large volume is released in the direction along the interface (in the in-plane direction) of the junction section between the through-via 3 and the wire 2X by the stress relaxation part 4, and the stress is thus relaxed. Therefore, occurrence of separation at the interface of the junction section (joint section) between the through-via 3 and the wire 2X may be reduced.

The stress relaxation part 4 includes portions 4A and 4B each made of an insulating material, and the protruding stress relaxation part 4 is electrically insulated from the wire 2X. Therefore, damage to a circuit including a transistor and the like due to the concentration of the electric field at the protruding stress relaxation part 4 during etching for a region for forming the through-via 3 may be reduced. In this way, while damage to the circuit may be reduced, the stress generated at the interface of the junction section between the through-via 3 and the wire 2X may be relaxed and the separation generated at the interface of the junction section may be reduced. Consequently, the yield and the reliability may increase.

As illustrated in FIG. 1A, a circuit layer 5 is provided on the front-surface side of the semiconductor substrate 1. The circuit layer 5 includes a transistor 5A, an element isolation region 5B formed by filling an element isolation groove in the semiconductor substrate 1 with an insulating material, and an insulating film 5C. The stress relaxation part 4 includes a portion 4A containing the same insulating material as that included in the element isolation region 5B, and a portion 4B containing the same insulating material as the material of the insulating film 5C. The stress relaxation part 4 includes, at its end, the portion 4A containing an insulating material. The stress relaxation part 4 may include the portions 4A and 4B including different insulating materials. The portion 4A of the stress relaxation part 4, the portion 4A being formed of the same insulating material as the element isolation region 5B, may be provided at the same position in the thickness direction as the element isolation region 5B. Because of this, the stress relaxation part 4 that protrudes toward the through-via 3 side and is disposed on a section of the wire 2X included in the wiring layer 2, the section being coupled to the through-via 3, has a large height (protrusion height). As a result, the stress relaxation effect may increase.

The semiconductor substrate 1 may be a silicon (Si) substrate. The through-via 3 may be a through-via containing copper (Cu) (metal through-via). For example, the material of the through-via 3 may be copper. The through-via 3 thus may be a through silicon via (TSV) that penetrates through the silicon substrate 1. The through-via 3 may be provided with a seed layer 3A, such as that made of, for example, Ti, TiN, Ta, or TaN.

Wires 2A (2X) included in the wiring layer 2 may be wires containing copper (Cu) (Cu wires; metal wires). For example, the wiring layer 2 has a structure in which the Cu wires 2A (2X) are embedded in an insulating film (interlayer insulating film) 2B. Since the wiring layer 2 has a multilayer wiring structure, the wiring layer 2 may be referred to as a multilayer wiring layer. As the wires 2A, for example, wires made of Cu, Al, CuAl, CuMn, W, Mo, Ru, or the like may be used. The wires 2A may include a barrier layer containing, for example, Ti, TiN, Ta, TaN, Co, or Ru, and/or a cap layer containing, for example, NiP, NiPW, CoW, CoWP, or Ru. As the insulating film 2B corresponding to the wiring layer 2, an insulating film, such as a film made of, for example, silicon oxide (SiO), silicon oxynitride (SiON), silicon oxycarbide (SiOC), or silicon carbonitride (SiCN), or a porous film thereof, may be used.

On the front-surface side of the silicon substrate 1, a circuit including the transistor 5A and the like, for example, LSI, is provided. The element isolation region 5B is formed by filling the element isolation groove in the semiconductor substrate 1 with silicon oxide (e.g., $SiO_2$), which is an insulating material. The element isolation region 5B is covered with a silicon oxide film (e.g., a SiO$_X$ film) that is the insulating film 5C. In this way, the circuit layer 5 including the transistor 5A, the element isolation region 5B, and the insulating film 5C is provided on the front-surface side of the silicon substrate 1.

The stress relaxation part 4 includes a portion 4A containing silicon oxide (e.g., SiO$_2$), which is the same insulating material as that included in the element isolation region 5B, and a portion 4B containing the same insulating material as the silicon oxide film (e.g., a SiO$_X$ film) corresponding to the insulating film 5C. Examples of the insulating material included in the element isolation region 5B include insulating materials, such as silicon oxides (SiO; e.g., SiO$_2$) and silicon nitrides (SiN; e.g., Si$_3$N$_4$). Examples of the material of the insulating film 5C include insulating materials, such as silicon oxides (SiO; e.g., SiO$_X$), silicon nitride (SiN), silicon oxynitride (SiON), fluorine-doped silicon oxides (e.g., fluorosilicate glass (FSG)), phosphorus-doped silicon oxides (e.g., phosphosilicate glass (PSG)), and boron-phosphorus-doped silicon oxides (e.g., borophosphosilicate glass (BPSG)).

The stress relaxation part 4 may include a portion made of an insulating material having a smaller thermal expansion coefficient than the material of the through-via 3. For example, the portions containing an insulating material having a smaller thermal expansion coefficient than the material of the through-via 3 may be formed of an insulating material, such as Si, SiO, SiN, SiON, SiC, AlO, or C.

The through-via 3 (e.g., TSV) has a large volume. The material of the through-via 3, for example, Cu, has a larger thermal expansion coefficient than the material of the semiconductor substrate 1, for example, Si. Because of this, stress is generated at the interface of the junction section between the through-via 3 and the wire 2X as a result of, for example, repeated expansion and contraction, as illustrated in FIGS. 13A and 13B, due to the heat generated during the fabrication process including the back-surface process and the subsequent bonding process by 3D stacking, and hence separation may occur at the interface of the junction section. For example, as illustrated in the position indicated by the arrow in FIG. 14B, which is an enlarged drawing of the portion enclosed by the rectangle in FIG. 14A, separation may occur at the interface of the junction section. The through-via may undergo plastic deformation. As a result, the yield and the reliability may decrease.

For example, when the through-via is formed by a via-last method, it may be difficult to maintain clean the bottom of a through-hole formed by etching away a region for forming the through-via, for example, the junction interface between the through-via and the wire included in the wiring layer. It may be accordingly difficult to improve the adhesion at the interface of the junction section between the through-via and the wire included in the wiring layer. Consequently, separation may occur at the interface of the junction section between the through-via and the wire, as mentioned above.

FIG. 15 is an example cross-sectional view of a semiconductor device. For example, in order to relax the stress generated at the interface of the junction section between the through-via and the wire and to reduce occurrence of separation at the interface of the junction section, the wire 2X to be coupled to the through-via may be provided with a protrusion 20 that protrudes toward the through-via side, as illustrated in FIG. 15. For example, when the material of the protrusion 20 has a larger thermal expansion coefficient than the material of the through-via, the stress generated at the interface of the junction section between the through-via and the wire may not be relaxed, and occurrence of separation may not be reduced at the interface of the junction section. In this case, the stress generated at the protrusion 20 may increase and this stress may induce separation at the interface of the junction section.

When the protrusion 20 contains a metal material, the electric field is concentrated in the protrusion 20 formed of the metal material, as illustrated in FIG. 15, during etching for a region for forming the through-via. Therefore, the circuit including the transistor 5A and the like may be damaged (charge damage) via the wire 2X having the protrusion 20, and thus the yield and the reliability may decrease.

With the above configuration of the semiconductor device, occurrence of the separation at the interface of the junction section between the through-via 3 and the wire 2X is reduced by relaxing the stress generated at the interface of the junction section. Consequently, the yield and the reliability may increase. For example, the stress relaxation part 4 is formed on a section of the wire 2X included in the wiring layer 2, the section being coupled to the through-via 3, such that the stress relaxation part 4 protrudes toward the through-via 3 side. The stress relaxation part 4 includes the portions 4A and 4B each made of an insulating material having a smaller thermal expansion coefficient than the material of the through-via 3.

FIGS. 3 to 12 illustrate an example of a method for fabricating a semiconductor device. The method for fabricating a semiconductor device includes a process of forming a through-hole 3X (see FIG. 4) and a process of forming a through-via 3 (see FIG. 6). The process of forming the through-hole 3X involves etching away a region for forming the through-via 3 that penetrates through a semiconductor substrate 1 from the back-surface side of the semiconductor substrate 1 having a wiring layer 2 on the front-surface side and is coupled to a wire 2X included in the wiring layer 2. A stress relaxation part 4 that protrudes toward the through-via 3 side is formed on a section of the wire 2X included in the wiring layer 2, the section being one that is to be coupled to the through-via 3. The stress relaxation part 4 includes portions 4A and 4B each made of an insulating material having a smaller thermal expansion coefficient than the material of the through-via 3. The process of forming the through-via 3 involves filling the through-hole 3X with the material of the through-via 3, the through-hole 3X being formed in the region for forming the through-via 3.

Figure 3:
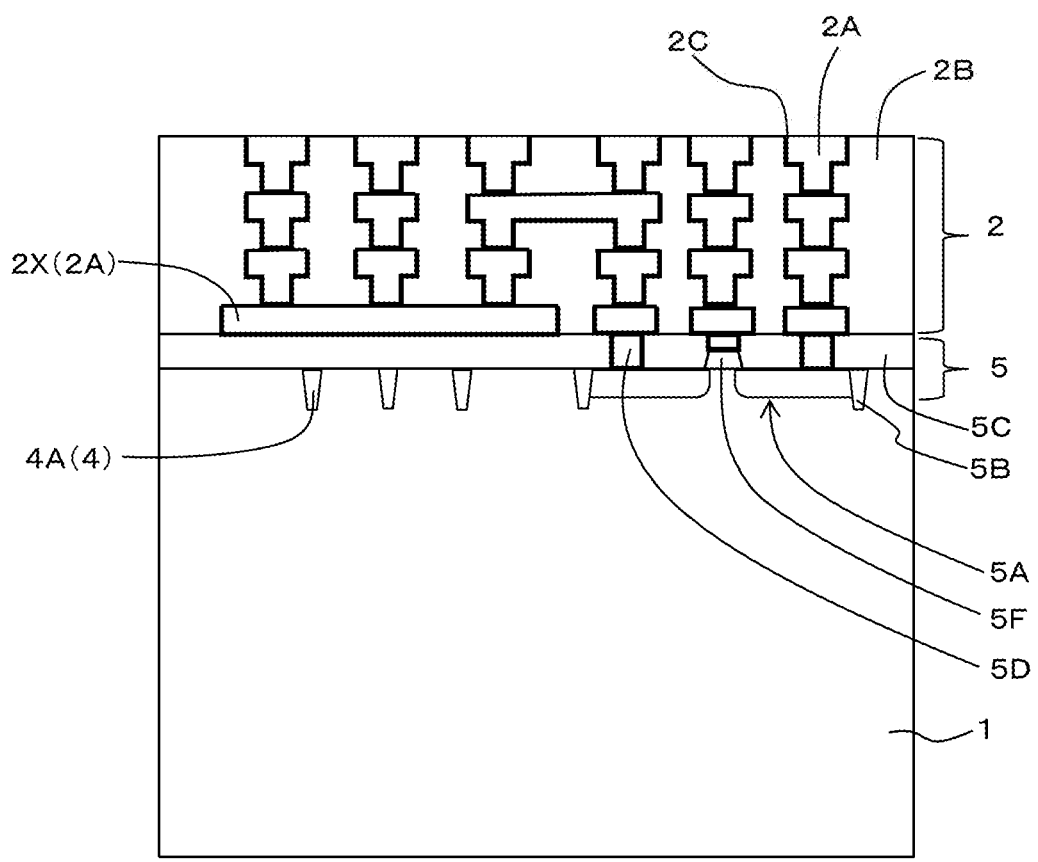
FIG. 3 illustrates an example of a method for fabricating a semiconductor device.

The method for fabricating a semiconductor device further includes a process of forming a circuit layer 5 on the front-surface side of the semiconductor substrate 1 (see FIG. 3). The circuit layer 5 includes a transistor 5A, an element isolation region 5B formed by filling an element isolation groove in the semiconductor substrate 1 with an insulating material, and an insulating film 5C. When the element isolation region 5B is formed in the process of forming the circuit layer 5, the portion 4A of the stress relaxation part 4, the portion 4A being made of the same insulating material as that included in the element isolation region 5B, is formed (see FIG. 3). In the process of forming the through-hole 3X, the stress relaxation part 4 including the portion 4A made of the same insulating material as that included in the element isolation region 5B and the portion 4B made of the same insulating material as the insulating film 5C is formed (see FIG. 4).

For example, LSI chips (semiconductor chips) having a TSV (through-via) are formed by a via-last method, and two LSI chips are stacked. The stacked LSI chips may be mounted on a package substrate, and a 3D stacked LSI package may be fabricated accordingly. As illustrated in FIG. 7A, a (LSI) circuit including a transistor and the like is formed on a silicon wafer (silicon substrate; semiconductor substrate) 1, and a wiring layer 2 is formed on the surface of this circuit.

As illustrated in FIG. 3, a (LSI) circuit including the transistor 5A, a plug 5D, and the like is formed on the front-surface side of the silicon wafer 1. An element isolation groove is formed in the silicon wafer 1 and filled with silicon oxide (e.g., $SiO_2$), which is an insulating material, to form the element isolation region 5B. These components are covered with a silicon oxide film (e.g., a $SiO_X$ film) that is the insulating film 5C. As a result, the circuit layer 5 including the transistor 5A, the element isolation region 5B, and the insulating film 5C is formed on the front-surface side of the silicon wafer 1. The material of the plug 5D may be tungsten (W). The insulating film 5C may have a thickness of about 0.3 µm. In FIG. 3, the reference sign 5F indicates a gate electrode.

A groove for forming the stress relaxation part 4 is formed in the region for forming a TSV 3 in the wafer 1 at substantially the same time and by substantially the same method as formation of the element isolation region 5B. The portion 4A of the stress relaxation part 4, the portion 4A including silicon oxide (e.g., $SiO_2$) that is the same insulating material as that included in the element isolation region 5B, is formed by filling the groove with silicon oxide (e.g., $SiO_2$), which is an insulating material. In this way, by forming a portion of the stress relaxation part 4 in substantially the same manner as that for the element isolation region 5B, the stress relaxation part 4 that protrudes toward the TSV 3 side and is disposed on a section of the Cu wire 2X in the lowermost layer included in the wiring layer 2, the section being one that is to be connected to the TSV 3, has a large height (protrusion height) (see FIG. 1A). As a result, the stress relaxation effect may increase.

On the circuit layer 5, a multilayer wiring layer having a multilayer wiring structure in which Cu wires 2A including a pad (electrode) 2X are embedded in an insulating film 2B is formed as the wiring layer 2. A TiN/Ti-stacked film is formed as a barrier layer (barrier metal) 2C for the Cu wires 2A. The thickness of a layer of the wire 2A may be about 0.3 µm. As illustrated in FIG. 7A, micro-bumps 6 are formed as terminals on the wiring layer 2. The micro-bumps 6 are each formed by forming a Cu pillar 6A on the wiring layer 2 and providing a solder 6B on the Cu pillar 6A. The wafer (LSI wafer) 1 having the micro-bumps 6 is prepared accordingly.

The silicon wafer 1 may have a thickness of about 775 µm and a size of about 300 mm. The micro-bumps 6 may have a diameter of about 40 µm, and the pitch between the micro-bumps 6 may be about 80 µm. In the micro-bump 6, the Cu pillar portion may have a height of about 20 µm, and the solder portion may have a height of about 15 µm. As illustrated in FIG. 7B, for example, the wafer 1 having the micro-bumps 6 is temporarily bonded onto a support substrate (support wafer) 7 made of Si, glass, or the like by using a temporary adhesive 8 while the side of the wafer 1 on which the micro-bumps 6 are disposed faces downward. The temporary adhesive 8 may have a thickness of about 60 µm. The support substrate 7 may have a thickness of about 775 µm.

Figure 4:
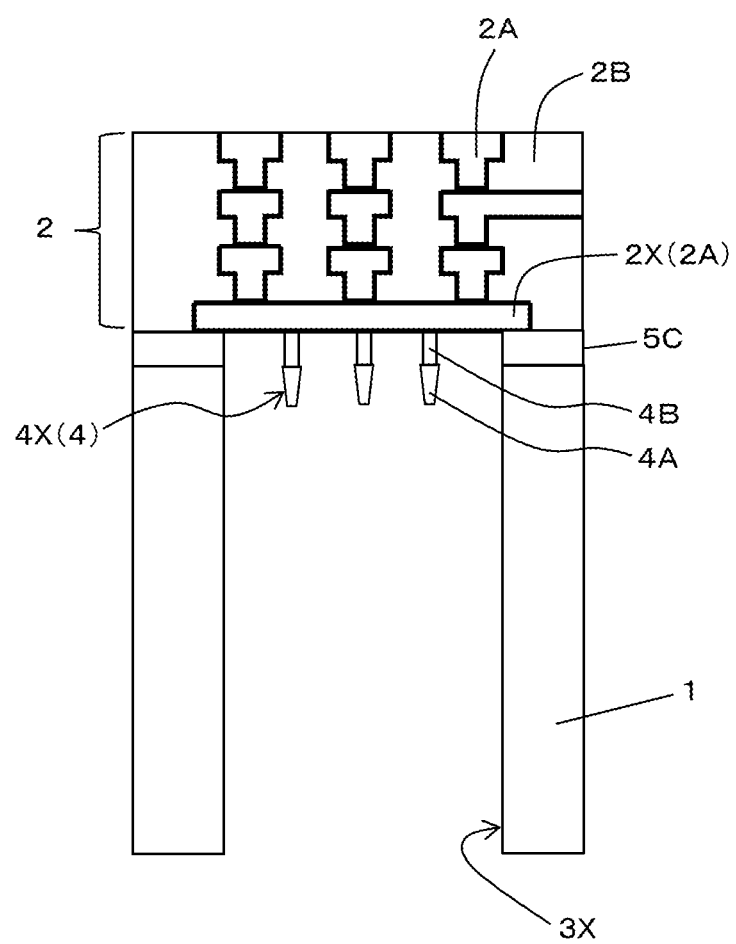
FIG. 4 illustrates the example of the method for fabricating the semiconductor device.

As illustrated in FIG. 8A, the thickness of the wafer 1 is reduced by grinding the back surface of the wafer 1, for example, by back grinding (BG) or chemical mechanical polishing (CMP). The thickness of the wafer 1 may be reduced to about 100 µm. As illustrated in FIGS. 8B and 4, the wafer 1 and the insulating film 5C are etched from the back-surface side of the wafer 1 and thus a through-hole 3X is formed in a region for forming the TSV 3. A hard mask is formed on the back-surface side of the wafer 1, a resist is patterned, and the hard mask is etched. The wafer 1 and the insulating film 5C are etched by using the patterned hard mask, and thus the through-hole 3X is formed in the region for forming the TSV 3. The hard mask may be a SiO film having a thickness of about 1 µm. The through-hole 3X formed in the region for forming the TSV 3 may have a diameter of about 10 µm.

The portion 4A of the stress relaxation part 4, the portion 4A containing silicon oxide (e.g., $SiO_2$) that is the same insulating material as that included in the element isolation region 5B, is formed in the region for forming the TSV 3 (see FIG. 3). As illustrated in FIG. 4, the portion 4A of the stress relaxation part 4, the portion 4A containing silicon oxide (e.g., $SiO_2$) that is the same insulating material as that included in the element isolation region 5B, thus remains unetched when the through-hole 3X is formed by etching away the region for forming the TSV 3. Furthermore, the portion 4A serves as a mask, and a portion of the silicon oxide film (e.g., a $SiO_X$ film) that is the insulating film 5C, the portion corresponding to the portion 4A, remains.

Therefore, the stress relaxation part 4 is formed in the region for forming the TSV 3 such that the stress relaxation part 4 protrudes from the Cu wire 2X in the lowermost layer included in the wiring layer 2. The stress relaxation part 4 includes the portion 4A containing silicon oxide (e.g., $SiO_2$) that is the same insulating material as that included in the element isolation region 5B, and the portion 4B containing the same insulating material as the silicon oxide film (e.g., a $SiO_X$ film) that is the insulating film 5C. As the stress relaxation part 4, plural pillar-shaped stress relaxation parts 4X are formed on a Cu pad (Cu electrode) 2X coupled to the TSV 3 in the Cu wires 2A included in the wiring layer 2, such that the pillar-shaped stress relaxation parts 4X protrude in the region for forming the TSV 3 (see FIG. 1B).

Figure 5:
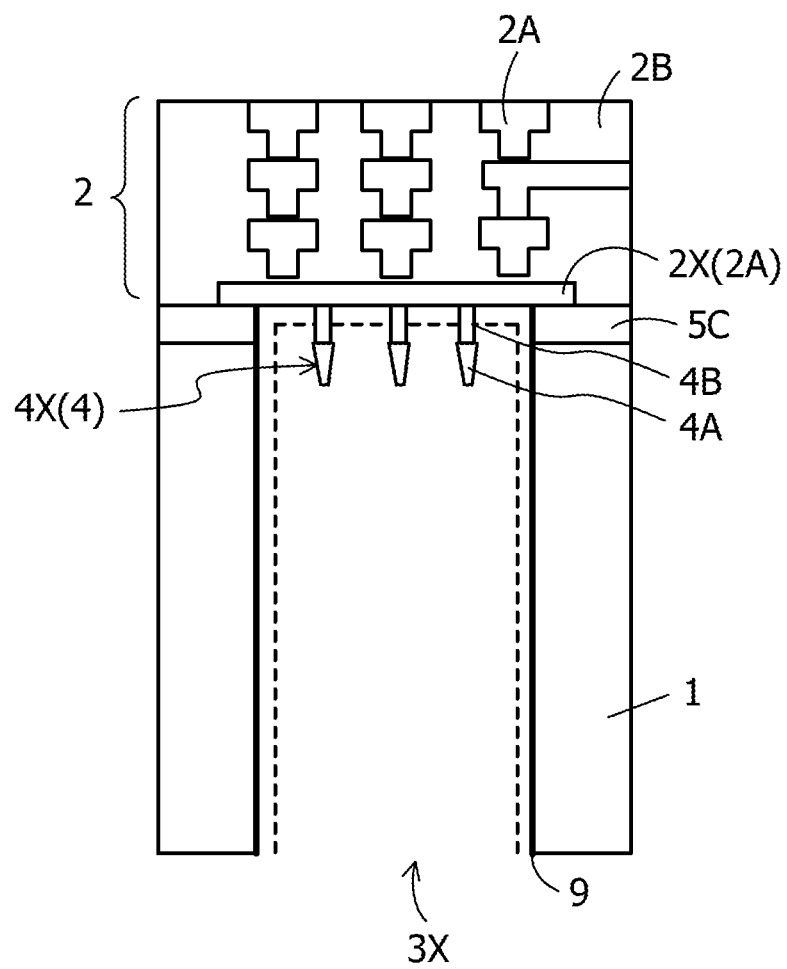
FIG. 5 illustrates the example of the method for fabricating the semiconductor device.

As illustrated in FIGS. 9A and 5, an insulating layer 9 is formed on the back surface of the wafer 1 by, for example, a CVD method. Since the through-hole 3X is formed in the region for forming the TSV 3 on the back-surface side of the wafer 1, the insulating layer 9 is also formed on the inner side (the side wall and the bottom) of the through-hole 3X (see the dotted line in FIG. 5). The insulating layer 9 formed on the bottom of the through-hole 3X is etched away in order to form an opening for the section to be bonded to the wire 2X included in the wiring layer 2 formed on the front-surface side of the wafer 1. The insulating layer 9 formed on the side wall of the through-hole 3X reduces its thickness and remains on the side wall of the through-hole 3X.

Figure 6:
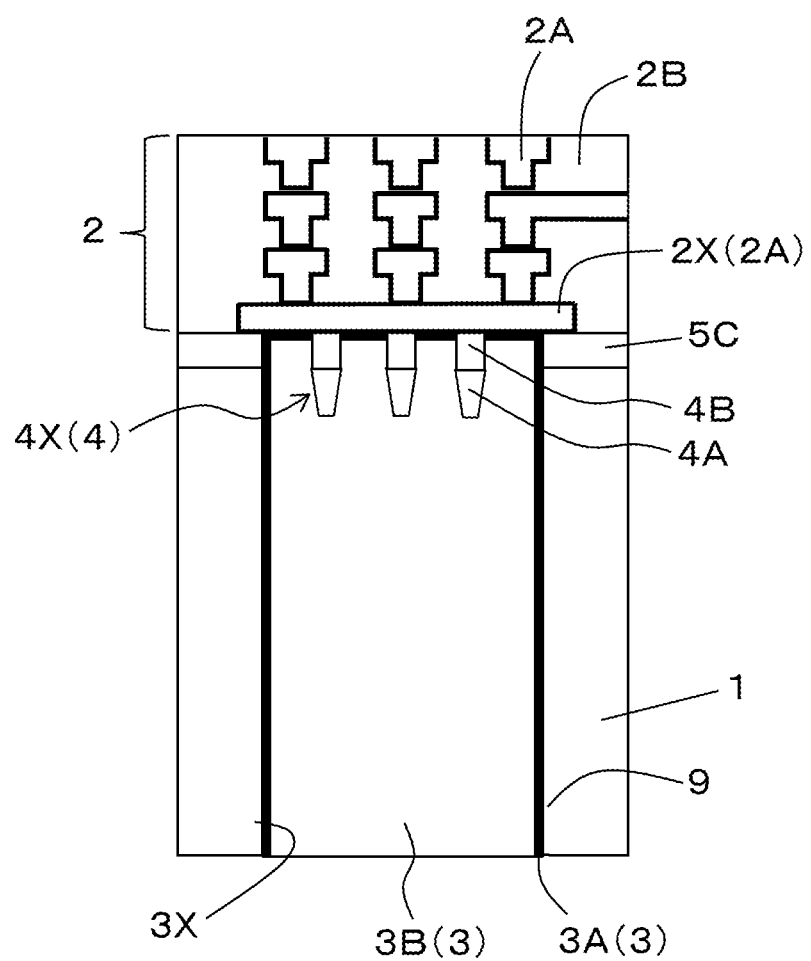
FIG. 6 illustrates the example of the method for fabricating the semiconductor device.

As illustrated in FIGS. 9B and 6, a seed layer 3A is formed, for example, by a sputtering method or a CVD method, on the back surface of the wafer 1 having the through-hole 3X formed in the region for forming the TSV 3. A Cu-coating layer 3B is formed by electroplating such that the through-hole 3X formed in the region for forming the TSV 3 is filled with the Cu-coating layer 3B and, as a result, the TSV 3 is formed. For example, the seed layer 3A is formed by stacking a Ti layer and a Cu layer. The thicknesses of the Ti layer and the Cu layer may be respectively about 50 nm and about 200 nm on the inner wall of the through-hole 3X formed in the region for forming the TSV 3.

As mentioned above, the stress relaxation part 4 is formed in the region for forming the TSV 3 of the wafer 1 such that the stress relaxation part 4 protrudes from the Cu wire 2X in the lowermost layer included in the wiring layer 2. The stress relaxation part 4 includes the portion 4A containing silicon oxide (e.g., SiO$_2$) that is the same insulating material as that included in the element isolation region 5B, and the portion 4B containing the same insulating material as the silicon oxide film (e.g., a SiO$_X$ film) that is the insulating film 5C (see FIG. 4).

As illustrated in FIG. 6, when the TSV 3 is formed by filling the through-hole 3X with the Cu-coating layer 3B, the through-hole 3X being formed in the region for forming the TSV 3, the stress relaxation part 4 is also embedded in the Cu-coating layer 3B. Hence, the stress relaxation part 4 is formed on a section of the Cu wire 2X included in the wiring layer 2, the section being coupled to the TSV 3, such that the stress relaxation part 4 protrudes toward the TSV 3 side. The stress relaxation part 4 includes the portion 4A containing silicon oxide (e.g., SiO$_2$) that is the same insulating material as that included in the element isolation region 5B, and the portion 4B containing the same insulating material as the silicon oxide film (e.g., a SiO$_X$ film) that is the insulating film 5C.

The stress relaxation part 4 is formed on a section of the Cu wire 2X included in the wiring layer 2, the section being coupled to the TSV 3, such that the stress relaxation part 4 protrudes toward the TSV 3 side. The stress relaxation part 4 includes the portions 4A and 4B each made of an insulating material having a smaller thermal expansion coefficient than the material of the TSV 3. As the stress relaxation part 4, plural pillar-shaped stress relaxation parts 4X are formed on the Cu pad (Cu electrode) 2X coupled to the TSV 3 in the Cu wires 2A included in the wiring layer 2 such that the pillar-shaped stress relaxation parts 4X protrude toward the TSV 3 side (see FIG. 1B).

Figure 10A:
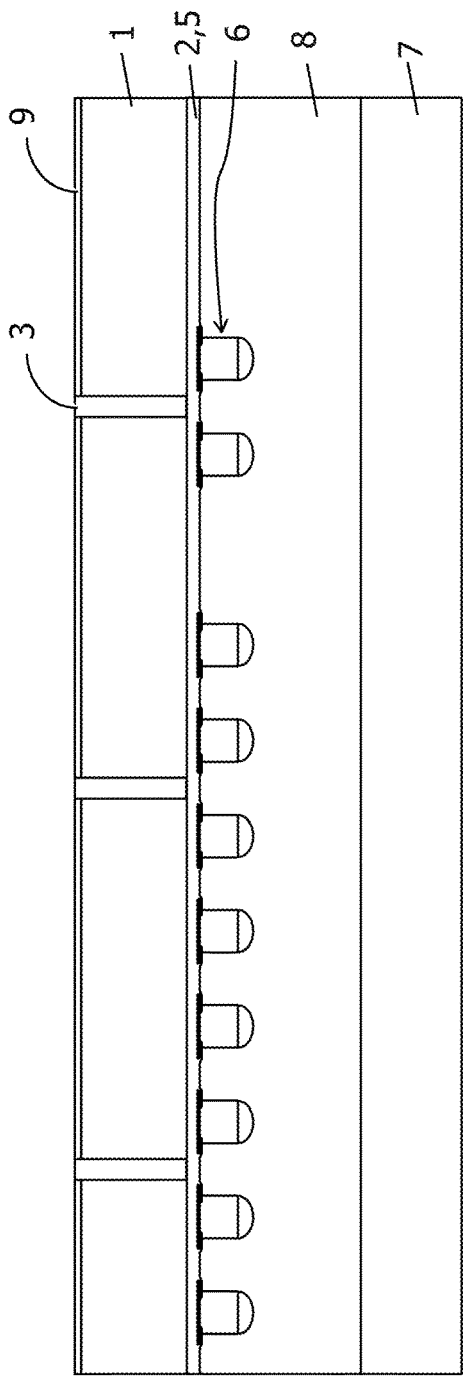
FIGS. 10A and 10B illustrate the example of the method for fabricating the semiconductor device.
Figure 10B:
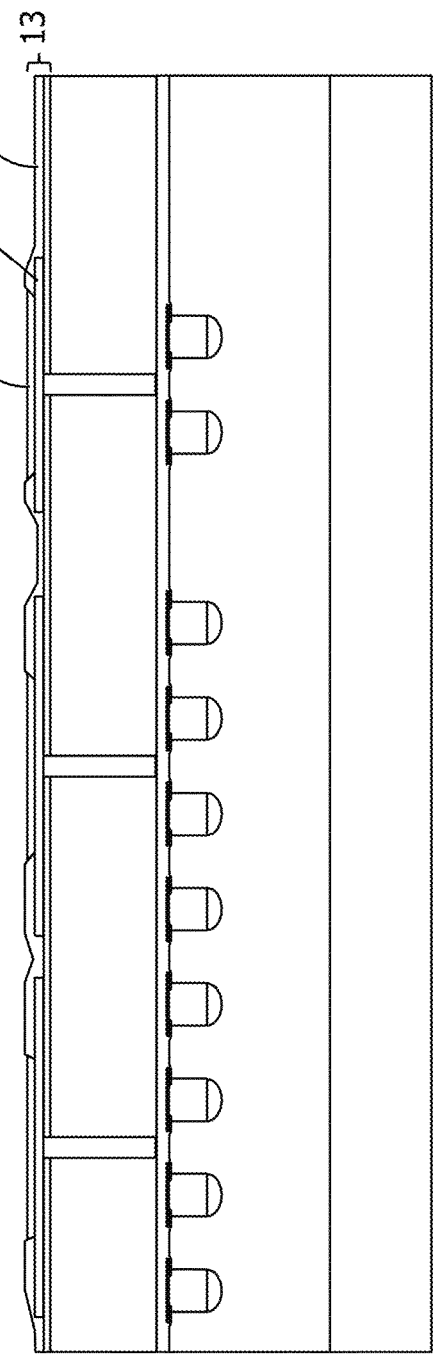

As illustrated in FIG. 10A, the Cu-coating layer 3B and the Cu seed layer 3A that are formed on the surface are removed, for example, by CMP, and TSVs 3 are isolated from each other. As illustrated in FIG. 10B, redistribution wires 10 are formed so as to be coupled to the TSVs 3, and covered with an insulating layer 11. Openings are formed in the insulating layer 11. Under bump metal (UBM) portions 12 are formed in the openings, and a redistribution layer 13 is thus formed.

The redistribution wires 10 are formed by, for example, a semi-additive process (SAP). For example, the seed layer is formed by stacking a Ti layer and a Cu layer by, for example, a sputtering method or an electroless plating method, and then a pattern is formed with a resist. A Cu layer is deposited on regions with no resist pattern by, for example, an electroplating method, the resist is stripped, and the residual seed layer is removed by, for example, wet etching. As a result, the redistribution wires 10 are formed. The thicknesses of the Ti layer and the Cu layer may be about 0.1 µm and about 5 µm, respectively. The insulating layer 11 may contain a polyimide resin (photosensitive resin) and may have a thickness of about 10 µm. The under bump metal portions 12 are each formed by, for example, stacking a Ti layer, a Cu layer, an Ni layer, and an Au layer by a semi-additive process. The thickness for these layers may be about 0.1 µm for the Ti layer, about 2 µm for the Cu layer, about 3 µm for the Ni layer, and about 0.05 µm for the Au layer.

As illustrated in FIG. 11A, the support substrate 7 is debonded, followed by dicing into individual pieces. This provides LSI chips having the TSV 3. After a dicing tape is placed on the redistribution layer 13 side, and the support substrate 7 is debonded, the wafer is cut into individual chips. As illustrated in FIG. 11B, an individual LSI chip 14 is placed on an LSI chip 15 provided separately, and the LSI chips 14 and 15 are bonded to each other by a reflow treatment. As a result, a stacked chip 16 is prepared. The LSI chip 15 provided separately may be a chip obtained without forming the TSV 3 or the redistribution layer 13 after back-surface grinding. The silicon substrate 1 of the LSI chip 15 provided separately may have a thickness of about 300 µm.

As illustrated in FIG. 12, the stacked chip 16 prepared as mentioned above is mounted on a package substrate 18 with a solder bump 17 therebetween, and a 3D stacked LSI package 19 is fabricated accordingly. The solder bump 17 is formed on the package substrate 18, and the stacked chip 16 is placed on the solder bump 17, followed by a reflow treatment in a reflow oven. After the stacked chip 16 is bonded to the package substrate 18 with the solder bump 17 therebetween, an underfill is applied for resin sealing, and the 3D stacked LSI package 19 is fabricated accordingly. The solder bump 17 may have a diameter of about 100 µm. The reflow treatment in the reflow oven may be performed at about 250° C. for about 5 minutes.

According to the semiconductor device and the method for fabricating the semiconductor device, occurrence of the separation at the interface of the junction section between the through-via 3 and the wire 2X is reduced by relaxing the stress generated at the interface of the junction section. Consequently, the yield and the reliability may increase. The semiconductor device illustrated in FIG. 1A includes the circuit layer 5 on the front-surface side of the semiconductor substrate 1. The circuit layer 5 includes the transistor 5A, the element isolation region 5B formed by filling an element isolation groove in the semiconductor substrate 1 with an insulating material, and the insulating film 5C. The stress relaxation part 4 includes the portion 4A containing substantially the same insulating material as that included in the element isolation region 5B, and the portion 4B containing substantially the same insulating material as the insulating film 5C.

Figure 16:
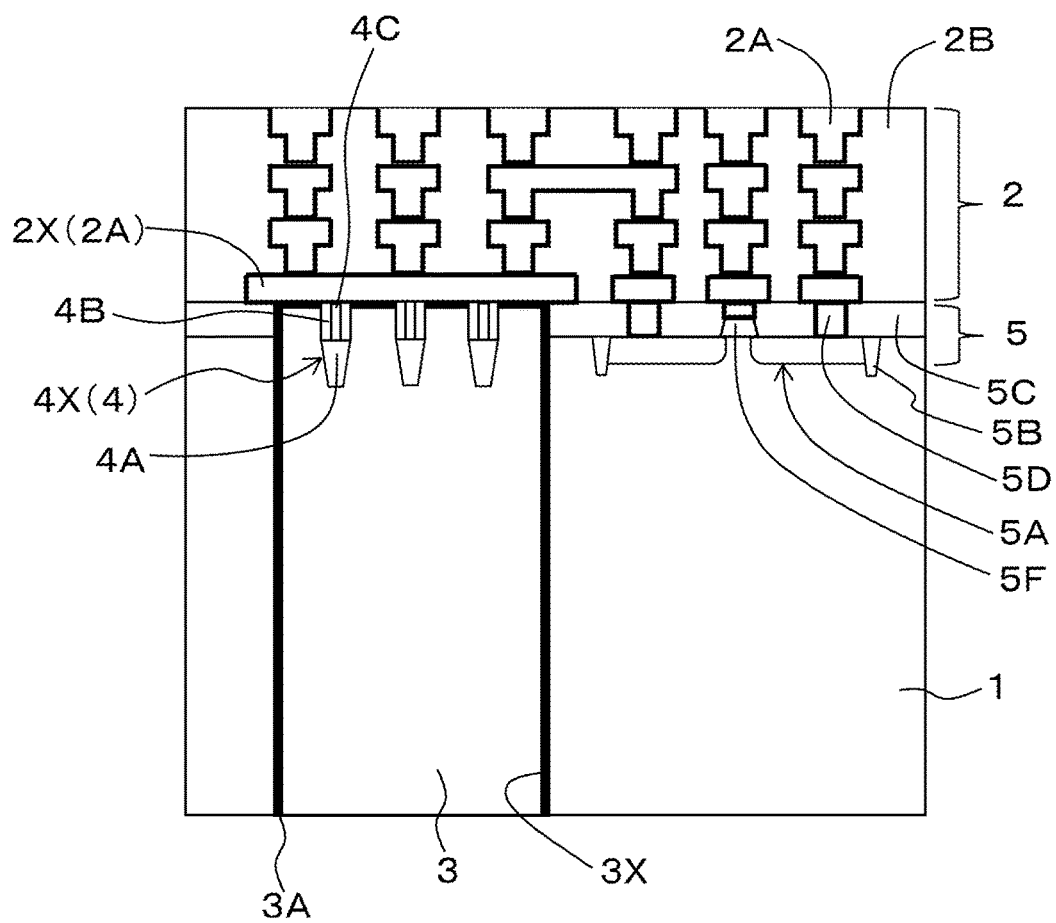
FIG. 16 is an example of a cross-sectional view of a semiconductor device.

FIG. 16 is an example of a cross-sectional view of a semiconductor device. For example, as illustrated in FIG. 16, the semiconductor device may include a circuit layer 5 on the front-surface side of a semiconductor substrate 1. The circuit layer 5 includes a transistor 5A, an element isolation region 5B formed by filling an element isolation groove in the semiconductor substrate 1 with an insulating material, a plug 5D coupled to the transistor 5A, and an insulating film 5C. For example, a stress relaxation part 4 may include a portion 4A containing substantially the same insulating material as that included in the element isolation region 5B, a portion 4B containing the same insulating material as the material of the insulating film 5C, and a portion 4C containing the same material as the material of the plug 5D. In FIG. 16, the reference sign 5F indicates a gate electrode.

In this case, the stress relaxation part 4 also includes the portion 4A made of an insulating material at its end. The stress relaxation part 4 includes the portions 4A and 4B made of different insulating materials. The material of the plug 5D is a metal material, such as tungsten (W). Since the material of the plug 5D included in the stress relaxation part 4 is a metal material, the adhesion at the junction section with the wire 2X may increase.

The portion 4C containing substantially the same material as the material of the plug 5D may be surrounded with the portion 4A containing substantially the same insulating material as that included in the element isolation region 5B and the portion 4B containing substantially the same insulating material as the material of the insulating film 5C. This allows electrical insulation between the front-surface side of the protruding stress relaxation part 4 and the portion 4C containing substantially the same material as the material of the plug 5D. Consequently, damage to the circuit including the transistor 5A and the like due to the concentration of the electric field at the protruding stress relaxation part 4 during etching for a region for forming a through-via 3 may be reduced.

The stress relaxation part 4 may also include the portion 4C containing substantially the same metal material as a metal material that is the material of the plug 5D, and may also include a portion made of another metal material. For example, the stress relaxation part 4 may include a portion including substantially the same metal material as a metal material (e.g., Ti, TiN, Ta, TaN, TiW, or a stacked structure, such as TiN/Ti) that is the material of a barrier film, and may include a portion containing a metal material, such as molybdenum (Mo).

As illustrated in FIG. 16, plural pillar-shaped stress relaxation parts 4X are provided as the protruding stress relaxation part 4 on a pad 2X in wires included in a wiring layer 2, the pad 2X being coupled to a through-via 3. On the pad 2X, plate-shaped stress relaxation parts 4Y that extend in the radial direction of the through-via 3 and intersect at a right angle may be provided as the protruding stress relaxation part 4 (see FIG. 2A). Plural pillar-shaped stress relaxation parts 4X may be provided as the protruding stress relaxation part 4 on plural wires 2Y (see FIG. 2B). Plural plate-shaped stress relaxation parts 4Z that extend so as to intersect the plural wires 2Y at a right angle may be provided as the protruding stress relaxation part 4 on the plural wires 2Y (see FIG. 2C).

The method for fabricating a semiconductor device illustrated in FIG. 16 includes a process of forming a circuit layer 5 on the front-surface side of a semiconductor substrate 1. The circuit layer 5 includes a transistor 5A, an element isolation region 5B formed by filling an element isolation groove in the semiconductor substrate 1 with an insulating material, a plug 5D coupled to the transistor 5A, and an insulating film 5C. When the element isolation region 5B is formed in the process of forming the circuit layer 5, a portion 4A of a stress relaxation part 4, the portion 4A being made of substantially the same insulating material as that included in the element isolation region 5B, may be formed. When the plug 5D is formed in the process of forming the circuit layer 5, a portion 4C containing substantially the same material as the material of the plug 5D may be formed on the portion 4A of the stress relaxation part 4, the portion 4A containing substantially the same insulating material as that included in the element isolation region 5B. Then, these components may be covered with the insulating film 5C.

The process of forming a through-hole 3X may involve forming the stress relaxation part 4 (4X) including the portion 4A containing substantially the same insulating material as that included in an element isolation region 5B, the portion 4B containing substantially the same insulating material as the material of the insulating film 5C, and the portion 4C containing substantially the same material as the material of the plug 5D. For example, the process of forming the through-hole 3X may involve forming the stress relaxation part 4 (4X) in which the portion 4C containing substantially the same material as the material of the plug 5D is surrounded with the portion 4A containing substantially the same insulating material as that included in the element isolation region 5B and the portion 4B containing substantially the same insulating material as the material of the insulating film 5C.

Figure 17:
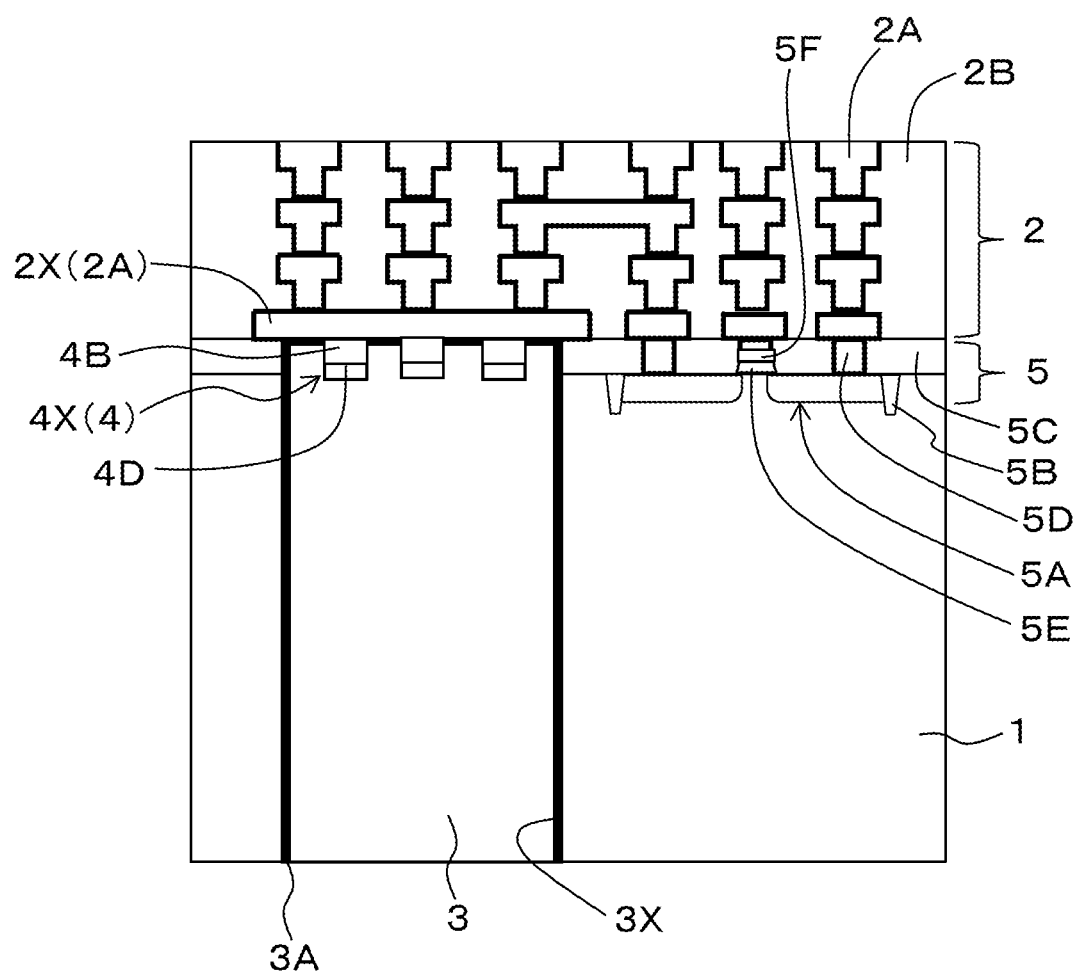
FIG. 17 is an example of a cross-sectional view of a semiconductor device.

FIG. 17 is an example of a cross-sectional view of a semiconductor device. For example, as illustrated in FIG. 17, the semiconductor device may include a circuit layer 5 on the front-surface side of a semiconductor substrate 1. The circuit layer 5 may include an insulating film 5C and a transistor 5A including a gate insulating film 5E. The stress relaxation part 4 may include a portion 4D containing substantially the same insulating material as the material of the gate insulating film 5E and a portion 4B containing substantially the same insulating material as the material of the insulating film 5C. In FIG. 17, the reference sign 5F indicates a gate electrode.

The stress relaxation part 4 includes the portion 4D made of an insulating material at its end. The stress relaxation part 4 may include the portions 4D and 4B made of different insulating materials. Examples of the material of the gate insulating film 5E include insulating materials (metal oxide materials), such as $HfO_2$, HfSiON, HfAlO, LaO, and $ZrO_2$. As illustrated in FIG. 17, plural pillar-shaped stress relaxation parts 4X may be provided as the protruding stress relaxation part 4 on a pad 2X in wires included in a wiring layer 2, the pad 2X being coupled to a through-via 3.

For example, on the pad 2X, plate-shaped stress relaxation parts 4Y that extend in the radial direction of the through-via 3 and intersect at a right angle may be provided as the protruding stress relaxation part 4 (see FIG. 2A). Plural pillar-shaped stress relaxation parts 4X may be provided as the protruding stress relaxation part 4 on plural wires 2Y (see FIG. 2B). Plural plate-shaped stress relaxation parts 4Z that extend so as to intersect plural wires 2Y at a right angle may be provided as the protruding stress relaxation part 4 on the plural wires 2Y (see FIG. 2C).

The method for fabricating a semiconductor device illustrated in FIG. 17 includes a process of forming the circuit layer 5 on the front-surface side of the semiconductor substrate 1. The circuit layer 5 includes the insulating film 5C and the transistor 5A including the gate insulating film 5E. When the gate insulating film 5E is formed in the process of forming the circuit layer 5, the portion 4D of the stress relaxation part 4, the portion 4D containing substantially the same insulating material as the material of the gate insulating film 5E, may be formed. Then, these components may be covered with the insulating film 5C.

The process of forming a through-hole 3X may involve forming the stress relaxation part 4 (4X) including the portion 4D containing substantially the same insulating material as the material of the gate insulating film 5E and the portion 4B containing substantially the same insulating material as the material of the insulating film 5C.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a semiconductor substrate;
an insulating layer provided on a front-surface side of the semiconductor substrate;
a wiring layer provided on the insulating layer;
a through-via that penetrates through the semiconductor substrate and the insulating layer from a back-surface side of the semiconductor substrate and is coupled to a wire included in the wiring layer; and a stress relaxation part provided in such a manner that the stress relaxation part protrudes inside of the through-via from a coupling portion in which the wire is coupled to the through-via and an end of the stress relaxation part extends to a portion of the through-via at which a sidewall of the through-via is surrounded by the substrate, the stress relaxation part including at least one insulating portion containing an insulating material having a smaller thermal expansion coefficient than a material of the through-via.

2. The semiconductor device according to claim 1, wherein the at least one insulating portion is provided at the end of the stress relaxation part.

3. The semiconductor device according to claim 1, further comprising:

a transistor in the insulating layer and the substrate; and an element isolation region formed by filling an element isolation groove in the semiconductor substrate with an insulating material.

4. The semiconductor device according to claim 3, wherein the stress relaxation part includes a first insulating portion containing a first insulating material included in the element isolation region and a second insulating portion containing a second insulating material included in the insulating layer.

5. The semiconductor device according to claim 3, wherein the insulating layer includes a plug coupled to the transistor, and the stress relaxation part includes:

a first insulating portion containing a first insulating material included in the element isolation region; and a third insulating portion containing a second insulating material included in the insulating layer and a material of the plug.

6. The semiconductor device according to claim 5, wherein the material of the plug is surrounded with the second insulating material in the third insulating portion.

7. The semiconductor device according to claim 3, wherein the transistor includes a gate insulating film, and the stress relaxation part includes:

a second insulating portion containing a second insulating material included in the insulating layer; and a fourth insulating portion containing a third insulating material of the gate insulating film.

8. The semiconductor device according to claim 1, wherein the stress relaxation part includes one or more portions having a shape which extends in a direction, one ends of the one or more portions is coupled to the coupling portion and the other ends of the one or more portions includes the insulating material.

9. The semiconductor device according to claim 1, wherein the through-via is formed by filling a conductivity material into an opening which penetrates through the semiconductor substrate and the insulating layer from the back-surface side of the semiconductor substrate, and the stress relaxation part other than the coupling portion is embedded in the conductivity material.

* * * * *